Figure 1:
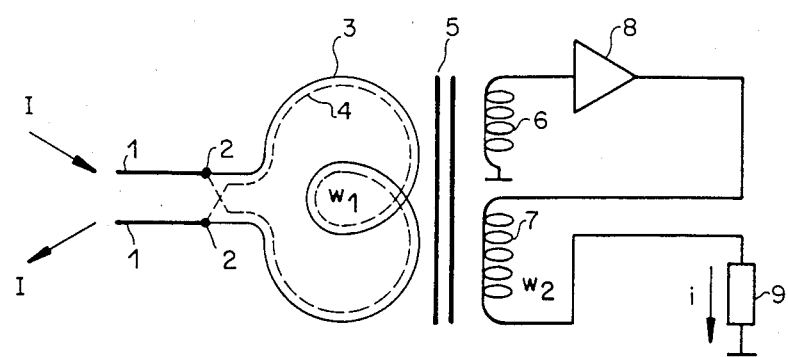

United States Patent [19]

Friedl

[11] Patent Number: 4,626,778

[45] Date of Patent: Dec. 2, 1986

[54] ACTIVE CURRENT SENSOR WITH PRIMARY REDUCING WINDING

[75] Inventor: Richard Friedl, Brunswick, Fed. Rep. of Germany

[73] Assignee: LGZ Landis & Gyr Zug AG, Zug, Switzerland

[21] Appl. No.: 509,447

[22] PCT Filed: Oct. 12, 1982

[86] PCT No.: PCT/EP82/00225
§ 371 Date: Jun. 9, 1983
§ 102(e) Date: Jun. 9, 1983

[87] PCT Pub. No.: WO83/01535
PCT Pub. Date: Apr. 28, 1983

[30] Foreign Application Priority Data

Oct. 13, 1981 [DE] Fed. Rep. of Germany ....... 3140544

[51] Int. Cl.$^4$ .................... H01F 40/06; G01R 15/02
[52] U.S. Cl. .................................. 324/127; 336/174; 336/232
[58] Field of Search ............... 324/127, 142; 323/355, 323/356, 357, 358; 336/171, 174, 175, 177, 181, 186, 187, 232, 225, 223

[56] References Cited

U.S. PATENT DOCUMENTS

| | | | |
|---|---|---|---|
| 2,535,554 | 12/1950 | Thurston | 336/186 X |
| 2,831,164 | 4/1958 | Johnson | 324/127 |
| 3,111,619 | 11/1963 | Gertsch | 323/355 |
| 3,916,310 | 10/1975 | Stark et al. | 324/127 |
| 4,182,982 | 1/1980 | Wolf et al. | 324/127 |
| 4,488,135 | 12/1984 | Schwartz | 336/232 X |

FOREIGN PATENT DOCUMENTS 1133817 7/1962 Fed. Rep. of Germany ...... 323/358
2505761 8/1975 Fed. Rep. of Germany .

Primary Examiner—Stewart J. Levy
Assistant Examiner—Stephen M. Baker
Attorney, Agent, or Firm—Marmorek, Guttman & Rubenstein

[57] ABSTRACT

The current to be measured (I) within a conductor (1), is branched into two conductors (3, 4) of the same conductor material, which have a resistance differing relatively little from one another and at opposite winding direction form the primary winding of an active current transducer. The secondary current (i) is determined by the resistance ratio of the two individual conductors (3, 4). Through mechanical, and therewith thermal contact between the two individual conductors (3, 4), their resistance-ratio is also maintained at high temperature coefficients and at higher conductor temperatures.

11 Claims, 9 Drawing Figures

Fig. 2a
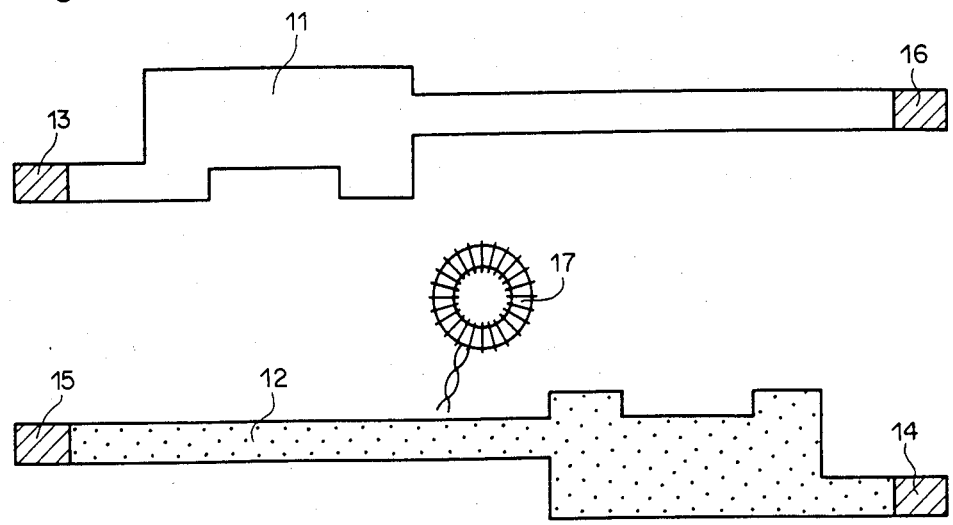
Fig. 2b
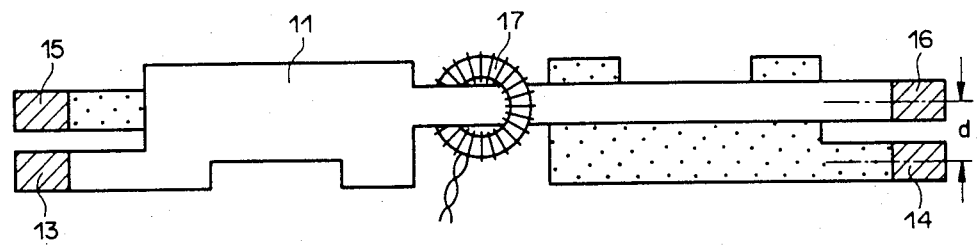
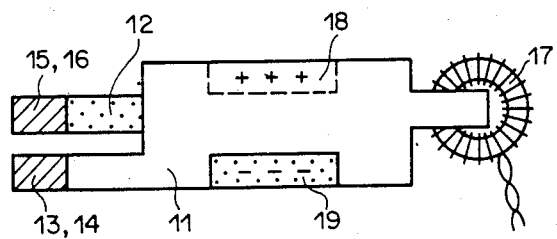
Fig. 2c

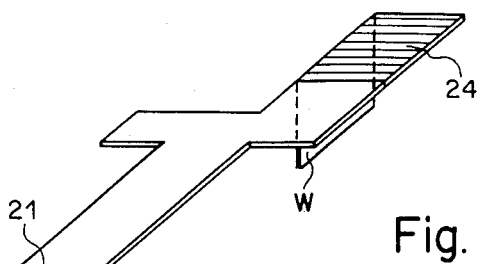
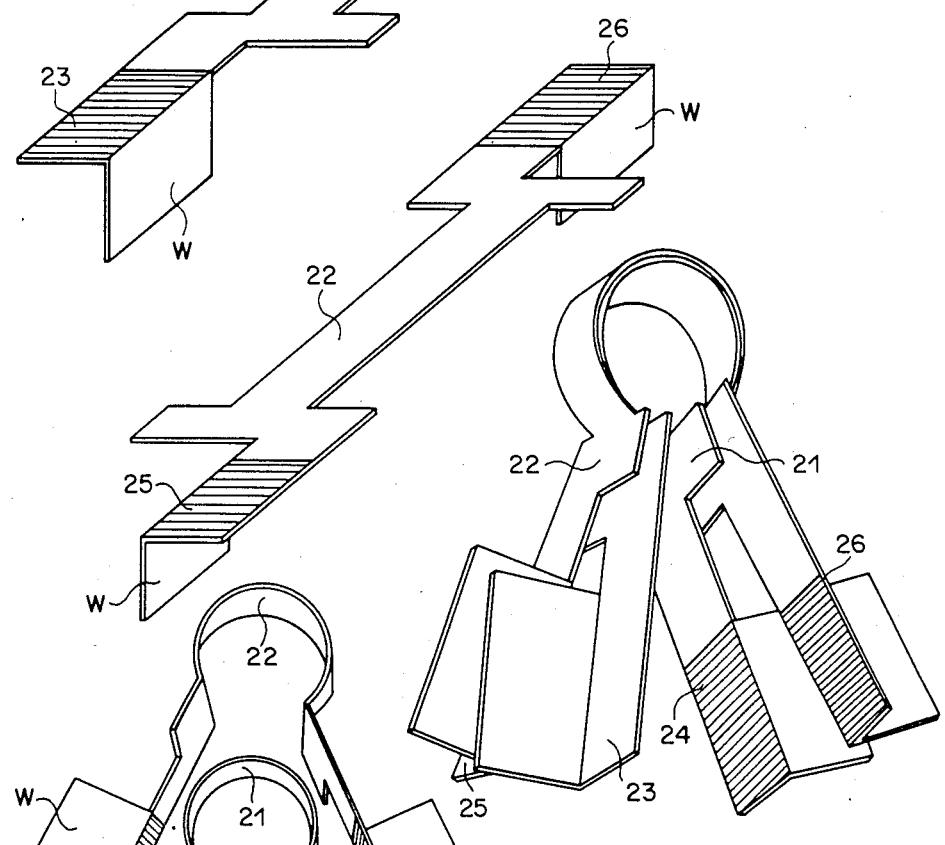
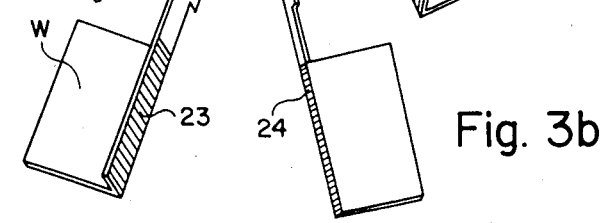
Fig. 3a
Fig. 3c
Fig. 3b

ACTIVE CURRENT SENSOR WITH PRIMARY REDUCING WINDING

The dimensions of active current sensors, which are constructed in form of inductive current comparators, are for the most essential part determined by the cross-section of the secondary winding, which is necessary in order to produce the Ampere-turn equilibrium. For a correct operating mode, current comparators with modern magnetic core materials with a high initial permeability, require only a relatively low degree of magnetic flux flow. Even if, for the measuring of higher currents the primary winding of such a transducer consists of a single winding the magnetic flux flow required for the measurement transmission is mostly higher by a multiple than is required for the core function. As a result of this, the expenditures relating to the conductor material, to the core material and power consumption for the electronics, are also correspondingly high. However, in particular when constructing static electric meters, it is necessary to keep the dimensions and the costs for the current comparators low. Several proposals for the solving of this problem are known, which by means of a resistance-shunt convey only a portion of the measuring current to the comparator. Such resistance-combinations are subject to the condition that the internal power consumption at the maximum current value has to remain within the order of magnitude of a few watts.

It follows from this, that the resistance-relationship between the main circuit and the shunt can be established only by means of well-conducting materials (for example copper, aluminum), the resistance values of which are adversely affected by large temperature coefficients. This again necessitates that for the attainment of a constant resistance-ratio the main circuit and the shunt conductor always have to have the same temperature. However, the latter cannot be achieved with simple means, since the shunt lead forms the primary winding of the current comparator and thereby cannot be in direct thermal contact with the main circuit lead.

Irrespective of the constructive difficulties in the construction of such a shunt-transducer, another aggravating difficulty persists when using this method with comparators which are also required to transmit direct-currents. As it is known, these comparators, generally in an additional winding, require an additional alternating-current signal for the generation of a magnetic flux flow modulation. Since the shunt, together with the main circuit forms a closed electric circuit with a relatively low ohmic resistance, the modulation leads to a transformation of the modulation signal in this circuit, so that the desired influence of the magnetization (for example, saturation) of the core cannot take place.

The invention has the task of creating an arrangement of an active current sensor, in the case of which the aforecited disadvantages and difficulties are practically eliminated in a simple manner.

This task is solved by the features cited in the characterizing clause of the patent claim 1.

By means of the arrangement designed according to the invention of an active current sensor with a primary reducing winding, the structural size of a current sensor can be drastically reduced, without noticeably decreasing the measuring range and the measuring accuracy, since in the case of this embodiment of a primary winding, only the difference of the currents flowing in the two conductors has to be determined, and the geometry of the winding permits both conductors to be brought in contact mechanically along their entire length between the branching points, so that both conductors always take on the same temperature.

By the inventive arrangement of a current sensor with a primary reducing winding, principle-conditioned modulation signals for the detection of direct-currents are not disturbed in a given case, since, due to the opposite winding direction of the two conductors of the reducing winding, voltages induced, at the same number of turns, by means of modulation signals in the conductors, are directed in opposite directions, and, thus, an equalizing current cannot develop via the conductor-branch.

In the following, a few exemplified embodiments of the invention will be explained in more detail, with reference to the accompanying drawings.

There are shown in:

FIG. 1, a schematic diagram of an active current sensor;

FIGS. 2a–2c, a first variant of a reducing winding in various manufacturing stages;

FIGS. 3a–3d, a second variant of a reducing winding; and

Figure 4:
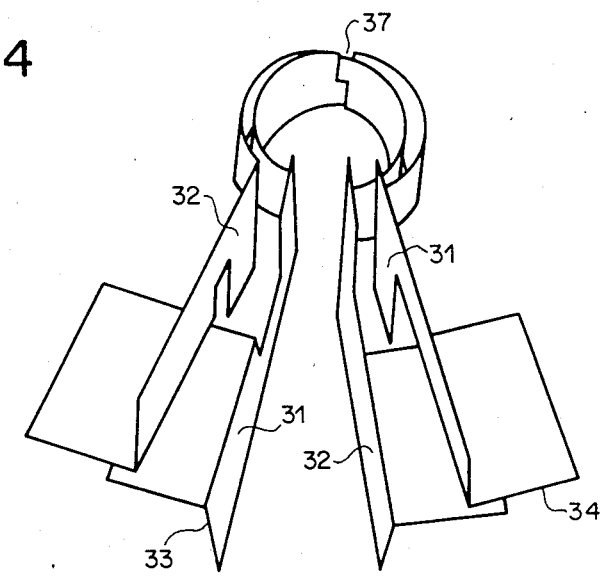

FIG. 4, a third variant.

The principle of the arrangement designed according to the invention, for an active alternating-current sensor, can be seen from FIG. 1. Through branching points 2, the current I which is to be measured in a conductor 1, is distributed over two conductors 3 and 4 which are insulated with respect to one another, and have respective conductor resistances $R_3$ and $R_4$, which, with an opposite winding direction relative to one another, form a primary winding having a number of turns $w_1$ of an active current transducer based on the magnetic flux flow, designated in what follows as a reducing winding, and which over their entire length remain in mechanical and therefore thermal contact between the branching points 2. The currents flowing in the two conductors 3,4 create a magnetic flux flow in opposite direction senses of a magnetic core 5. A detector winding 6 is connected with the input of an amplifier 8, the output of which is connected to a series connection consisting of a secondary winding 7 and of a load 8. Together with the magnetic core 5, the detector winding 6, the amplifier 8, the secondary winding 7 with the number of turns $w_2$ and the current i in the load 9, the transformation ratio where the amplification of the amplifier 8 has been assumed to be infinite is $$\frac{i}{I} = \frac{w_1}{w_2} \cdot \frac{R_3 - R_4}{R_3 + R_4}$$

The use of the primary reducing winding is not restricted to alternating-current sensors. It can equally be the primary winding of active sensors which are conceived for direct-currents or for mixed-currents.

The described arrangement, particularly in cases involving high alternating-currents which, in given cases, also contain large portions of direct-currents, permits a correct transformation of a testing current with relatively small and inexpensive current sensors (current transducers), which can be processed by electronic measuring devices and which is galvanically separated from the current to be measured.

With reference to FIGS. 2 to 4, advantageous constructive embodiments of the primary winding are described. Thereby, solutions are given for the problems involved in the following:

1. Construction of reducing windings with flat conductors;
2. Construction of such reducing windings for the reduction of construction-conditioned error angles;
3. Device provided at the reducing windings for the complete adjustment of an error angle;
4. Construction of reducing windings for the fine adjustment of the transmission ratio;
5. Protective device against mechanical stresses at the connecting terminals, for the mechanical uncoupling of both connections of the reducing windings.

An expedient form of the reducing winding (compare FIG. 2), consists of at least two flat conductors 11, 12 implemented as punch-pressed components, (preferably made from copper sheeting), which flat conductors are electrically insulated with respect to one another, and whose first ends 13, 14 are connected with one another, and whose second ends 15, 16 are electrically connected with one another, whereby these junctures either directly or via additional leads form the connections for the current to be measured, and the branch conductors originating from a juncture envelop a magnetic core 17 in an opposite sense of direction and the electrical resistances of the two branch conductors 11, 12 which are implemented in the form of flat conductors, differ through different widths and/or thicknesses, namely by the amount necessary for the attainment of a desired magnetic flux flow difference in the core, but whose extremities are shifted transversely to the conductor direction and parallel to the flat side of the conductor, by the desired distance d for the current connection, whereby the individual conductors are in thermal contact with one another practically over their entire length and whereby the current connections come to lie against one another free from any special foldings of the conductors.

FIG. 2 shows an exemplified embodiment of a reducing winding for toroidal cores. The branch conductors 11 and 12 shown in FIG. 2a, are, according to FIG. 2b inserted through the toroidal core 17 and, according to FIG. 2c are placed around the toroidal core 17 in such a manner, so that the extremity 13 of the conductor 11 coincides with the extremity 14 of the conductor 12, and the extremity 16 of the conductor 11 coincides with the extremity 15 of the conductor 12, with the extremity 16 of the conductor 11, and in each case are electrically interconnected with one another, in certain cases by means of (non-illustrated) branch lines, forming junctures for the current to be measured. The partial width-expansions of the flat conductors serve particularly for the thermal contact between the individual conductors, for the mechanical stabilization and the affixation of the current connections, for example by cementing. At positions 18 and 19 of the arrangement a subsequent primary, in given cases computer controlled, value-equalization of the transducer conversion can be undertaken in a positive and negative direction, namely in that at one of the branch lines 11, 12 conducting material is removed either through boring, milling or sandblasting.

FIG. 3 shows an exemplified embodiment of a reducing winding with flat conductors for pot cores.

Figure 3D:
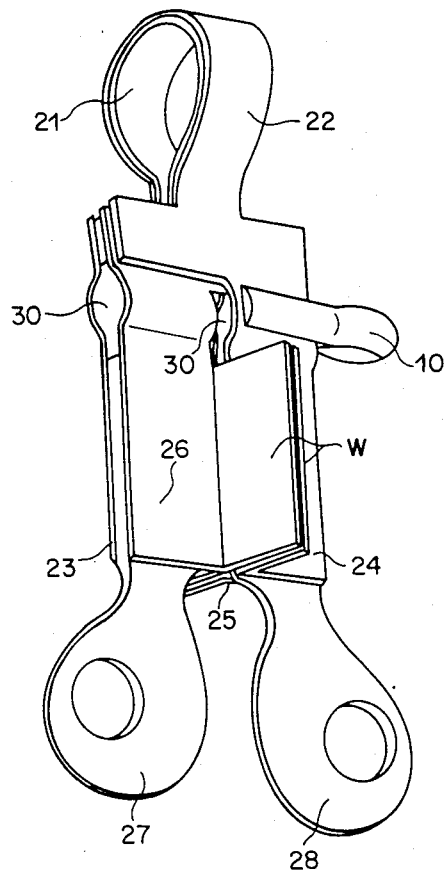

Two punch-pressed metal sheets of the same kind which have the same surface area measurements, but thicknesses of different dimensions, are, according to FIG. 3a, covered with an electrically insulating layer (for example lacquer) up to the contact surfaces 23, 24, 25, 26. The flap-like metal sheet sections W, which are bent downwardly at a right angle, after bending and uniting the branch conductors 21, 22 serve for the thermal coupling and for the mechanical stabilization of the leads 27, 28 (FIG. 3d). FIG. 3c shows the principle of the assembly of the preformed individual conductors 21, 22, in accordance with FIG. 3b.

In accordance with FIG. 3d, in each case, the contact surfaces 23 and 26 are electrically interconnected with a first lead 27 (for example through soldering or brazing), and to contact surfaces 25 and 24 with a second lead 28, while the insulated flap-like metal sheet sections W, which, in each case, come to lie on top of one another, are glued to one another.

In FIG. 3d, crimped sections 30 are indicated in the branches of conductors 23 and 26, as well as 24 and 25, into which a ferromagnetic yoke 10 is inserted for the purpose of compensation of phase errors. Depending on the direction of the error angle, the yoke 10 can be inserted into the left or right crimped section. The directional change is also achieved when the yoke 10 does not envelop the first branch-conductor shown above, but envelops the second branch-conductor disposed therebelow.

In order to eliminate the influence of mechanical stresses between the connector leads onto the branch lines of the reducing winding, at least one of the two leads 27, 28 can be implemented flexibly.

The error angle between the current to be measured (primary current) and the secondary current of the current sensor brought about by the geometrical differences between the branch-conductors 11, 12 or 21, 22 can be kept low when the construction is selected in such a manner, so that the angle of the resistances of the two branch-conductors are as equal as possible.

This can be advantageously accomplished in the manner that the first branch-conductor consists of two individual flat conductors electrically interconnected at the extremities enveloping the magnetic core in the same sense of direction between which the second branch-conductor is embedded, which surrounds the magnetic core in the opposite sense of direction.

Another possibility for the adjustment of the angles of the resistances of the two branch-conductors consists in accordance with FIG. 4, in that, while having different conductor (sheet metal) thicknesses, both branch-conductors(flat conductors)31, 32 have the same (punch-pressed) cut, and in that the first branch-conductor 31, approximately half way between its first extremity 33 to its second extremity 34, at the point of encirclement of the (non-illustrated) magnetic core 5, changes its geometric position with the second branch-conductor 32, which uptil now has been lying on the periphery, in the direction toward its second extremity 34 with reference to the core envelopment so as to now lie on the second branch-conductor 32, and that both branch-conductors 31, 32 at their intersection area 37, over a relatively small region, have conductor material removed by slightly more than half their width, whereby the change of position can be undertaken without any change of the total width of the branch-conductors 31, 32 which lie on top of one another.

I claim:

1. A current sensor comprising a primary winding and at least one secondary winding magnetically coupled by a core, wherein the primary winding comprises first and second generally strip-shaped flat electrical conductors of the same material having different resistances, which conductors are electrically connected together at their ends and which are elsewhere electrically insulated from each other, and each of which passes through the core with a single turn and in the opposite winding direction to the other, so that the magnetomotive force through the core is determined by the difference between the partial currents flowing in the first and second flat conductors, and wherein the first and second flat conductors are disposed so that their flat sides are in thermal contact with each other over substantially their entire length.

2. A current sensor according to claim 1, wherein the ends of each of the flat conductors are displaced relative to each other transversely with respect to the conductor direction and parallel to their flat sides, in such a way that one end of each flat conductor coincides with one end of the other flat conductor, but that the two ends of each flat conductor are spaced from each other.

3. A current sensor according to claim 1, wherein the first flat conductor embraces the second flat conductor substantially over its entire winding length.

4. A current sensor according to claim 1, wherein the first flat conductor embraces the second flat conductor substantially over half its winding length and the second conductor embraces the first flat conductor substantially over the other half of its winding length.

5. A current sensor according to claim 1, wherein one of the two flat conductors is embraced by a ferromagnetic element to provide phase displacement angle compensation.

6. A current sensor according to claim 5, wherein the ferromagnetic element is an iron loop member which is open at one end.

7. A current sensor according to claim 1, wherein each flat conductor has a cut-out portion which permits subsequent removal of conductor material from the other flat conductor at its portion adjacent the cut-out portion.

8. A current sensor comprising a primary winding and at least one secondary winding, magnetically coupled by a core, wherein the primary winding comprises first and second generally strip-shaped flat electrical conductors, having different resistances, which conductors are electrically connected together at their ends and which are elsewhere electrically insulated from each other and each of which passes through the core with a single turn in the opposite winding direction to the other, so that the magnetomotive force through the core is determined by the difference between the partial currents flowing in the first and second flat conductors and wherein the first and second flat conductors are disposed so that their flat sides are in thermal contact with each other over substantially their entire length, so that the two conductors are not heated to unequal temperatures when they carry different partial currents.

9. A current sensor comprising a primary winding and at least one secondary winding magnetically coupled by a core, wherein the primary winding comprises first and second generally strip-shaped flat electrical conductors of the same material having different resistances, which conductors are electrically connected together at their ends and which are elsewhere electrically insulated from each other, and each of which passes through the core with a single turn and in the opposite winding direction to the other, so that the magnetomotive force through the core is determined by the difference between the partial currents flowing in the first and second flat conductors, said first and second flat conductors being disposed so that their flat sides are in thermal contact with each other over substantially their entire length and so that one end of each flat conductor coincides with one end of the other flat conductor but that the two ends of each flat conductor are transversely spaced from each other.

10. The sensor of claim 8, wherein said first and second flat conductors comprising the primary each include a relatively wide portion of predetermined area.

11. A current sensor comprising a primary winding and at least one secondary winding magnetically coupled by a core, wherein the primary winding comprises first and second generally strip-shaped flat electrical conductors of the same material having different resistances which conductors are electrically connected together at their ends and which are elsewhere electrically insulated from each other and each of which passes through the core with a single turn and in the opposite winding direction to the other, so that the magneto motive force through the core is determined by the difference between the partial currents flowing in the first and second flat conductors and wherein the first and second flat conductors are disposed so that their flat surfaces are in thermal contact with each other substantially over their entire length and wherein the first flat conductor embraces the second flat conductor substantially over the entire winding length.

* * * * *